United States Patent
Rossi et al.

(10) Patent No.: US 11,443,077 B2
(45) Date of Patent: Sep. 13, 2022

(54) CONCURRENT PROJECT REALIZATION SYSTEM AND TOOLS

(71) Applicant: Verizon Patent and Licensing Inc., Arlington, VA (US)

(72) Inventors: Joseph A. Rossi, Sandy Hook, CT (US); Lisa Brinkman, Summit, NJ (US); Trevor Jones, Toronto (CA); Annette Morlino, Rye Brook, NY (US); Marianne Millnamow, Huntington Bay, NY (US); Derek K. Chin, Morristown, NJ (US); Sonya Dufner, New York, NY (US); Louis Milo, New York, NY (US); Jill Daniele, New York, NY (US); Marla Shalit, Randolph, NJ (US); Nathalia Uquillas, Clifton, NJ (US); John Greer, Massapequa, NY (US); Karen L. Ehrenworth, Cranbury, NJ (US); Robert Zuffi, New York, NY (US); Karl Anoushian, Floral Park, NY (US); Michael Siciliano, Sewell, NJ (US); William H. Peet, Monroe, CT (US); Christine Cush, Laurence Harbor, NJ (US); Raymond H. Brungard, Basking Ridge, NJ (US); John Gols, Huntington, NY (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 370 days.

(21) Appl. No.: 16/427,628

(22) Filed: May 31, 2019

(65) Prior Publication Data
US 2020/0380081 A1 Dec. 3, 2020

(51) Int. Cl.
*G06F 30/13* (2020.01)
*G06Q 10/06* (2012.01)
*G06F 30/18* (2020.01)

(52) U.S. Cl.
CPC .............. *G06F 30/13* (2020.01); *G06F 30/18* (2020.01); *G06Q 10/067* (2013.01); *G06Q 10/06313* (2013.01)

(58) Field of Classification Search
CPC .......................... G06Q 10/06313; G06F 30/13
See application file for complete search history.

(56) References Cited

U.S. PATENT DOCUMENTS

| | | | |
|---|---|---|---|
| 9,955,318 B1* | 4/2018 | Scheper | G06Q 10/063114 |
| 2001/0047251 A1* | 11/2001 | Kemp | G06F 30/13 703/1 |

(Continued)

OTHER PUBLICATIONS

Cory, Clark A. "Utilization of 2D, 3D, or 4D CAD in construction communication documentation." Proceedings Fifth International Conference on Information Visualisation. IEEE, 2001. (Year: 2001).*

(Continued)

*Primary Examiner* — Boris Gorney
*Assistant Examiner* — David A Hopkins

(57) ABSTRACT

Systems and methods provide improved physical space planning and development. One or more network devices obtain a business profile of a workgroup using an activity-based workspace and determine space requirements for the business profile. The network devices store component parameters for design components that can potentially be deployed to the activity-based workspace and solicit, via a graphical user interface, a workspace layout for the activity-based workspace. The soliciting includes providing a list of the design components that can be selectively placed within the workspace layout. The network devices receive, via the graphical user interface, design components within the (Continued)

workspace layout to create a proposed design; generate an interactive three-dimensional rendering of the proposed design; validate project timeline for the activity-based workspace, based on the proposed design and the stored parameters for the design components in the proposed design; and verify the proposed design against the space requirements.

20 Claims, 14 Drawing Sheets

(56) References Cited

U.S. PATENT DOCUMENTS

| | | | |
|---|---|---|---|
| 2004/0074173 A1* | 4/2004 | Miller | G06Q 10/06 52/234 |
| 2005/0171876 A1* | 8/2005 | Golden | G06Q 10/087 705/30 |
| 2008/0183483 A1* | 7/2008 | Hart | G06F 30/13 705/1.1 |
| 2009/0187384 A1* | 7/2009 | Nonaka | G06F 30/13 703/1 |
| 2010/0198563 A1* | 8/2010 | Plewe | G06F 30/392 703/1 |
| 2013/0066599 A1* | 3/2013 | Omiya | A47C 31/126 703/1 |
| 2013/0074180 A1* | 3/2013 | Chim | G06F 21/33 726/18 |
| 2014/0288890 A1* | 9/2014 | Khainson | G16H 40/20 703/1 |
| 2017/0177747 A1* | 6/2017 | Atherton | G06F 30/13 |
| 2019/0205484 A1* | 7/2019 | Morkos | G06Q 10/06315 |
| 2019/0303512 A1* | 10/2019 | Davies | G06F 30/13 |
| 2019/0347367 A1* | 11/2019 | Livnat | G06T 11/206 |
| 2020/0034503 A1* | 1/2020 | Livnat | G06F 30/20 |
| 2020/0134243 A1* | 4/2020 | Vardi | G06Q 10/10 |

OTHER PUBLICATIONS

SpaceIQ, SpaceIQ Workplace Operations Product Video, Youtube video from Oct. 31, 2018 (Year: 2018).*

SpaceIQ.com webpage, accessed via the Wayback Machine, Archive date of Dec. 2018 (Year: 2018).*

* cited by examiner

CONCURRENT PROJECT REALIZATION SYSTEM AND TOOLS

BACKGROUND

Workspace development involves configuring office space to accommodate workers and work tools. Current workspace designs emphasize open floorplans, which are intended to enhance the ability of workers to collaborate while also realizing efficiencies by recognizing that many workers are not in their workspace every day and rely on portable tools (e.g., mobile phones, portable computing devices, cloud-based information, etc.) that do not require a specific physical location. Many businesses are converting their existing workspace to the open floorplan, requiring redesign and construction. Even existing open floorplan workspaces may require renovation or redesign to better accommodate the work and workforce for which they are to be used.

BRIEF DESCRIPTION OF THE DRAWINGS

FIG. 7 shows an exemplary user interface that may be generated by the feasibility engine of FIG. 2;

FIG. 9 shows an exemplary user interface that may be generated by the design component engine of FIG. 2;

DETAILED DESCRIPTION OF PREFERRED EMBODIMENTS

The following detailed description refers to the accompanying drawings. The same reference numbers in different drawings may identify the same or similar elements.

Systems and methods described herein provide a toolset and processes that improve on techniques used for physical space planning and development in the architecture, building and real estate fields. The systems and methods may be used by corporate entities, for example, to implement activity-based workspace (ABW) programs or other modular workspace programs.

Existing workspace development processes and tools allow for rudimentary planning for workspace layout and construction. Typical existing systems include drafting tools to perform space layout, estimation tools to determine costs, and project planning tools to plan the timing requirements for the various tasks that must be coordinated amongst the service providers to complete the project. These tools permit the project manager to provide interested parties (e.g., a client, government agencies, impacted workers, etc.) with an estimate of how a proposed workspace renovation will look upon completion, how much it will cost, and how much time it will take. Proposed designs typically go through a review process to address concerns raised by interested parties, requiring manual revisions using the tools. Furthermore, design tools provide limited ability to visualize the final product, leading to misunderstandings about the impact of the design, wasted time and money to resolve problems, and missed opportunities to optimize designs based on feedback.

According to implementations described herein, a Concurrent Project Delivery system (CPDS) delivers workspace redesigns in significantly reduced time compared to existing project timelines, with higher optimization of client approval and cost efficiency. The CPDS uses tools that take design guidelines, business requirements, and design component characteristics and create a design that is easily visualized by interested parties, quickly modifiable on a real-time basis, and can be made to conform to (or indicate deviations from) project constraints.

Figure 1:
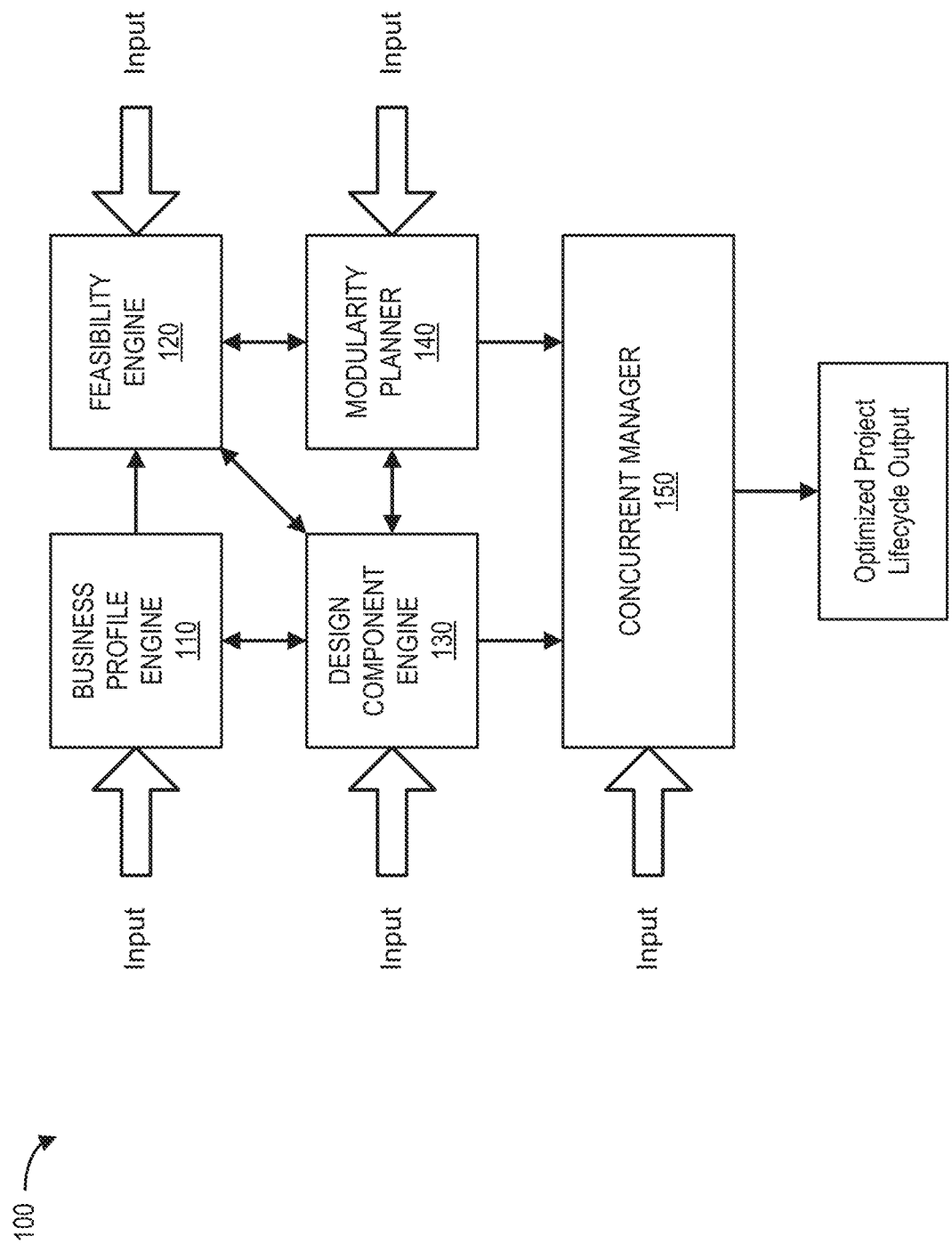
FIG. 1 illustrates concepts described herein.

FIG. 1 illustrates concepts of a Concurrent Workspace Development system 100 as described herein. As shown in FIG. 1, CPDS 100 may include a business profiles engine 110, a feasibility engine 120, a design component engine 130, a modularity planner 140, and a concurrent manager 150.

Business profiles engine 110 may store and apply business profiles for different workforce types. For example, business profiles engine 110 may store information associated with a department of a business, such that when a department space needs to be configured, and the business profile can be used in space configuration. Department-level profiles are useful to allow for the differences in space-utilization by different job types. Information in a business profile may include, for example: a headcount, a leverage ratio, a collaboration-to-focus space ratio (or any other activity-based space ratios), and specialty space amounts.

Feasibility engine 120 may be used to assess potential layouts based on relevant inputs. As described further herein, relevant inputs to the feasibility tool may include: cost, timing, business profile information, and layout information. Feasibility engine 120 may apply the inputs to proposed designs and produces indications of violations of input requirements. For example, when a workspace design is edited to remove a "focus" room element, the feasibility tool may indicate that change violates the collaboration-focus ratio in the business profile for the workspace.

Design component engine 130 may store parameters that define the space being designed. These parameters can include the physical layout of the space, such as dimensions, utility locations, appliance siting specifications, allowable furniture space, etc. A user may provide the parameters to design component engine 130, for example, via a graphical user interface or through data files.

Modularity planner 140 may store a library of available design elements that can potentially be deployed to a workspace. As described further herein, the design elements may include, for example, furniture, partitions, office equipment, specialized equipment (e.g., lab equipment), permanent construction, etc. Modularity planner 140 may provide a user interface for a design layout. Design layout may include, for example, a manual process of adding design components to a representation of the space to create a floorplan. As described further herein, the representation of the space may include a virtual rendering of fixed components of a workspace (e.g., fixed walls, ceilings, flooring, columns, etc.) into which modular components may be inserted.

Concurrent manager 150 allows for creation of project timelines based on details of the design (e.g., from design component engine 130 and modularity planner 140). One of the capabilities of concurrent manager 150 includes the ability to enable concurrent development. That is, development processes that can be done concurrently are scheduled in overlapping ways, allowing for a quicker completion time. The concurrent manager 150 uses the design component data (e.g., from modularity planner 140) to determine when orders need to be placed to timely acquire design component supplies, how dependencies impact installation, installation time estimates, etc. Concurrent manager 150 may allow designers to prepare specifications within a reduced timeframe and order materials earlier to support a compressed project lifecycle. According to an implementation, concurrent manager 150 may also include a proposal feature, whereby a service provider can make a proposal for providing a service (e.g., electrical installation) associated with an item specified in the project management timeline, knowing the timing, cost parameters, and floorplan.

According to one implementation, as design elements are added using modularity planner 140, the design element information can be used by concurrent manager 150 to dynamically update the project information. For example, a design element (e.g., an employee workstation, a door, etc.) may be placed on the space representation, and concurrent manager 150 may (1) adjust the project cost to reflect the cost of the workstation, (2) adjust the project timeline to reflect the time required to acquire the workstation, (3) adjust the project work orders to reflect the supplier information, and (4) calculate the usage information to measure against the requirements of the business profile. In another implementation, concurrent manager 150 may validate a project timeline, based on design element information, to ensure the timeline is consistent with component acquisition times, installation timeframes, and the like.

As shown in FIG. 1, the different functions of CPDS 100 (e.g., business profiles engine 110, feasibility engine 120, design component engine 130, modularity planner 140, and concurrent manager 150) may communicate with each other to automatically develop and exchange project planning resources. Additionally, input (e.g., from designers, customers, suppliers, etc.) may be provided at each stage to supplement, override, replace, or change data relied upon by CPDS 100.

Figure 2:
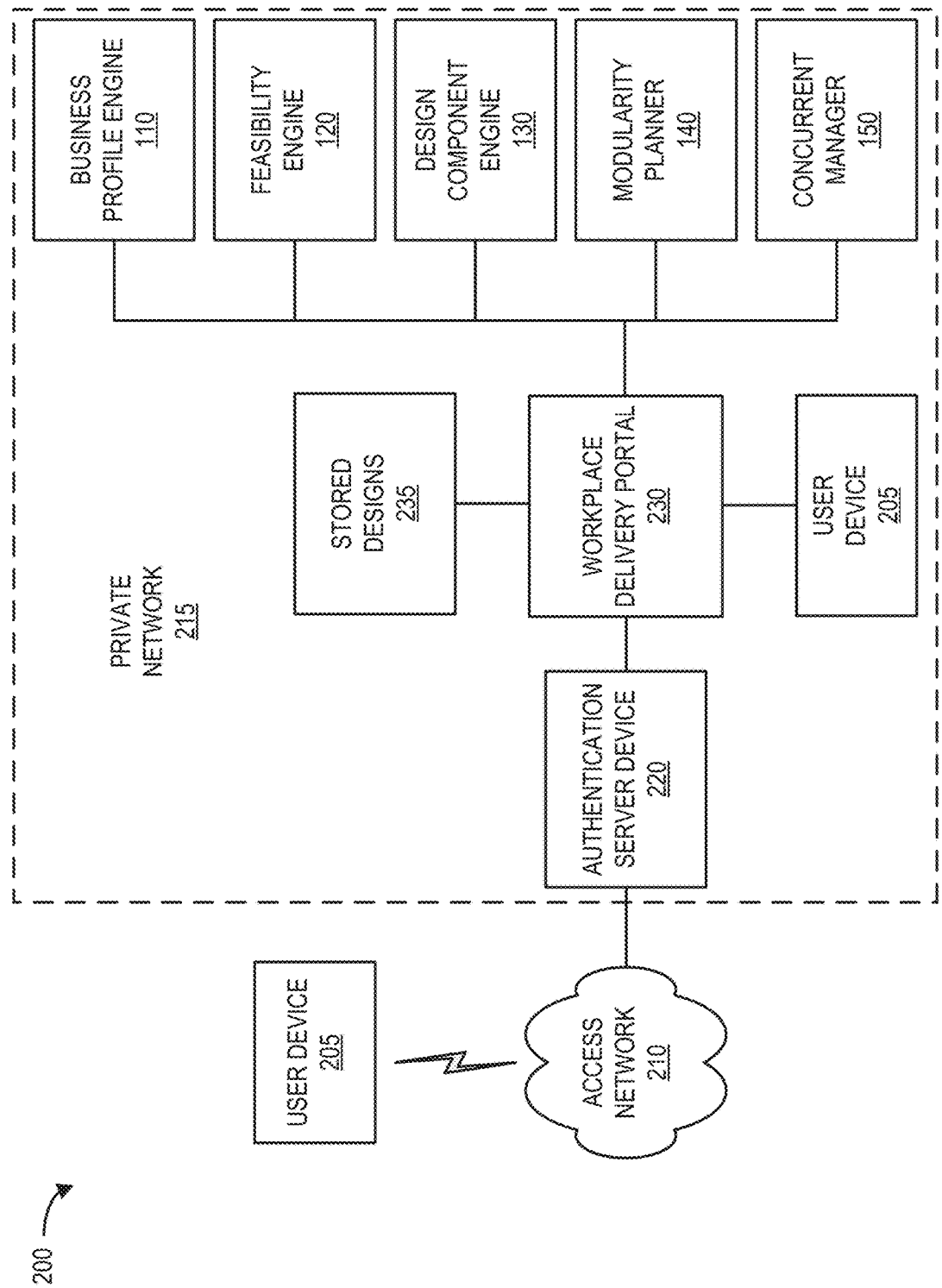
FIG. 2 illustrates an exemplary network in which systems and methods described herein, may be implemented.

FIG. 2 illustrates an exemplary network 200 in which the CPDS described herein, may be implemented. As shown in FIG. 2, network 200 may include user devices 205, an access network 210, and a private network 215. Devices and/or networks of FIG. 2 may be connected via wired and/or wireless connections.

User device 205 may include an end device, a client device, a server device, or another type of computing device. User device 205 may be a mobile device. For example, client device 150 may be implemented as a smartphone, a tablet device, a netbook, a computer (e.g., a laptop, a palmtop, etc.), or another type of mobile device. Alternatively, user device 205 may be a non-mobile (e.g., stationary) device. For example, client device 150 may be implemented as a terminal or desktop computer. In one implementation, user device 205 may include a web browser or other software to enable user device 205 to access web sites or other information for the CWD service from devices in private network 120 (e.g., workplace delivery portal 230, business profiles engine 110, etc.). In another implementation, user device 205 includes, or is linked to, an application on whose behalf user device 205 communicates with private network 215 to read or query file data. In one implementation, user device 205 may be directly connected within private network 215. As also shown in FIG. 2, a user device 205 may access private network 215 externally through access network 210.

Access network 210 may include one or multiple networks of one or multiple types. For example, access network 210 may be implemented to include a terrestrial network, a satellite network, a wireless network, and/or a wired network. According to an exemplary implementation, access network 210 includes a radio access network (RAN) and core network for a broadband cellular network. Depending on the implementation, access network 210 may include various network elements, such as a base station (BS), a Node B, an evolved Node B (eNB), a BS controller, a radio network controller (RNC), a femto device, a pico device, a home eNB, a relay node, a wireless access point, or other type of wireless node that provides wireless access. In other aspects, access network 105 may include a wired network. For example, access network 210 may include an optical network or a cable network.

Private network 215 may include, for example, one or more private networks. Some of the private networks include Internet Protocol (IP) networks that use a private IP address space. Private network 215 may include a local area network (LAN), an intranet, a private wide area network (WAN), etc. As shown in FIG. 2, private network 215 may include user devices 205, business profiles engine 110, feasibility engine 120, design component engine 130, modularity planner 140, concurrent manager 150, authentication server device 220, and workplace delivery portal 230. Private network 215 may also include other network components (not shown) such as routers, switches, gateways, servers, etc. In one implementation, private network 215 may implement one or more Virtual Private Networks (VPNs) for providing communication between, for example, any of user devices 205, business profiles engine 110, feasibility engine 120, design component engine 130, modularity planner 140, concurrent manager 150 and workplace delivery portal 230. Private network 215 may be protected/separated from other networks, such as a public network, by a firewall. In another implementation, CPDS 100 may be implemented as a cloud-based system.

Authentication server device 220 (also referred to as "authentication server 220" or "gateway 220") may include a network device that may implement techniques for authenticating, a user, an application, and/or the corresponding user device 205 upon which the application is installed, that requests access to private network 215. To access certain data or services of private network 215, authentication server 220 may require a user of user device 110 to provide appropriate credentials, such as a user identifier and a correct corresponding password. According to one implementation, authentication server 220 may enforce different access levels for different users, where each access level grants or restricts access to select features of private network 215. For example, to ensure that services offered by private network 215 are available to only authorized devices/users, users may be registered and assigned different access levels or to a particular access group. Access levels may be hierarchical (e.g., with each level granting access to more information), distributed (e.g., with each access level granting access to different information), or combinations thereof. Authentication server 220 may store permissions (e.g., to access levels) assigned to each user. Permissions to different access levels may be added to or removed from a user's permissions set.

Workplace delivery portal 230 may include one or more network devices, server devices, or other types of computation or communication devices, that provide controlled external access to various components of CPDS 100. For example, workplace delivery portal 230 may enable an authorized customer to access designs and schedules for particular customers/users residing in stored designs 235. In one implementation, workplace delivery portal 230 may provide a common web-based interface to access multiple types of services (e.g., CWD services and other services). Access to data and/or services via workplace delivery portal 230 may be restricted for example to users with registered accounts and secure passwords.

Each of business profiles engine 110, feasibility engine 120, design component engine 130, modularity planner 140, and concurrent manager 150 may be accessed by user devices 205 (e.g., through workplace delivery portal 230) to perform aspects of physical workspace planning and development. Details of business profiles engine 110, feasibility engine 120, design component engine 130, modularity planner 140, and concurrent manager 150 are described further, for example, on connection with FIGS. 4-13 below.

Figure 3:
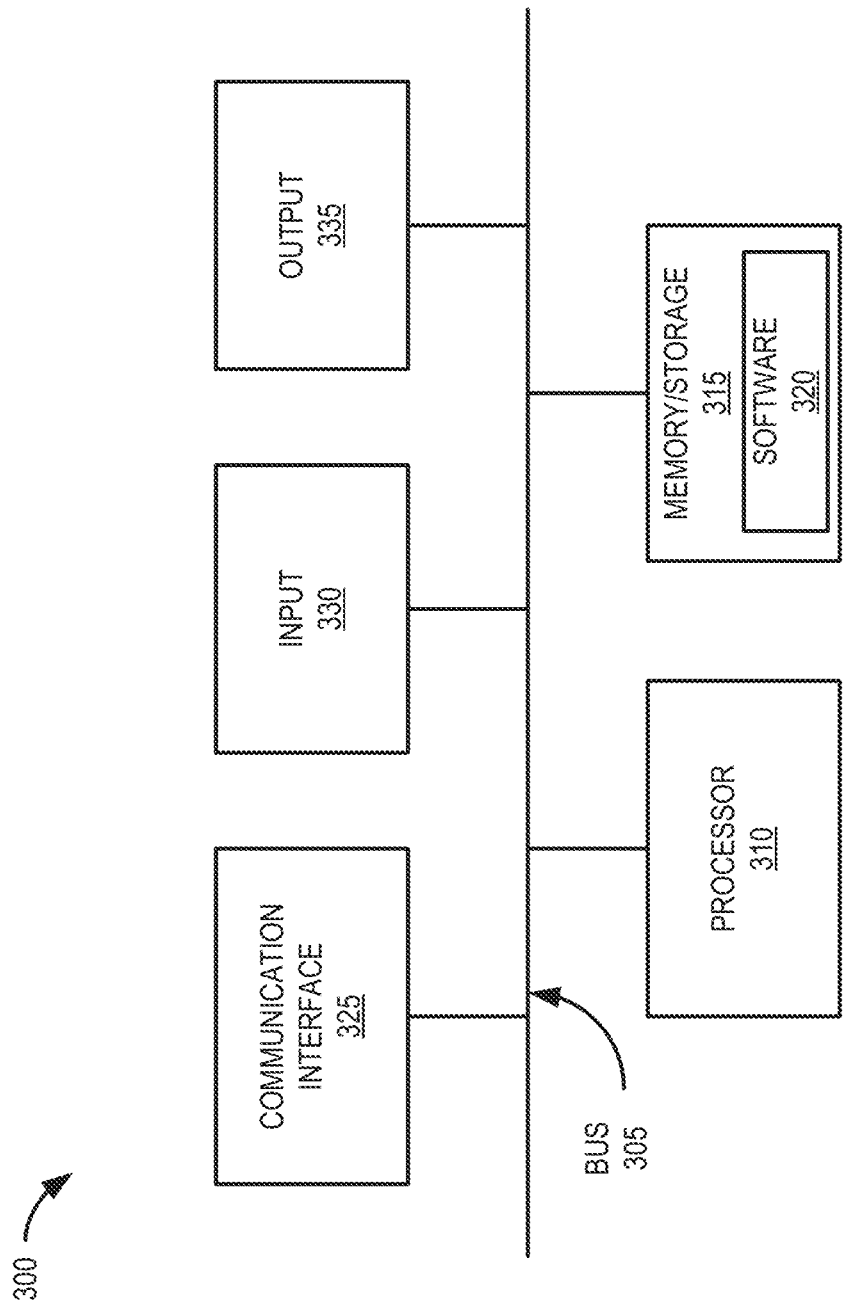
FIG. 3 depicts exemplary components of a device that may be used within the network of FIG. 2.

FIG. 3 illustrates exemplary components of a device 300 that may correspond to one or more of the devices described herein. For example, device 300 may correspond to components included in business profiles engine 110, feasibility engine 120, design component engine 130, modularity planner 140, concurrent manager 150, user device 205, authentication server device 220, or workplace delivery portal 230. In another implementation, one or more of business profiles engine 110, feasibility engine 120, design component engine 130, modularity planner 140, concurrent manager 150, user device 205, authentication server device 220, or workplace delivery portal 230 may be implemented as a virtual machine including a software-based emulation of a device 300. As illustrated in FIG. 3, according to an exemplary embodiment, device 300 includes a bus 305, a processor 310, a memory/storage 315 that stores software 320, a communication interface 325, an input 330, and an output 335. According to other embodiments, device 300 may include fewer components, additional components, different components, and/or a different arrangement of components than those illustrated in FIG. 3 and described herein.

Bus 305 includes a path that permits communication among the components of device 300. For example, bus 305 may include a system bus, an address bus, a data bus, and/or a control bus. Bus 305 may also include bus drivers, bus arbiters, bus interfaces, and/or clocks.

Processor 310 includes one or multiple processors, microprocessors, data processors, co-processors, application specific integrated circuits (ASICs), controllers, programmable logic devices, chipsets, field-programmable gate arrays (FPGAs), application specific instruction-set processors (ASIPs), system-on-chips (SoCs), central processing units (CPUs) (e.g., one or multiple cores), microcontrollers, and/or some other type of component that interprets and/or executes instructions and/or data. Processor 310 may be implemented as hardware (e.g., a microprocessor, etc.), a combination of hardware and software (e.g., a SoC, an ASIC, etc.), may include one or multiple memories (e.g., cache, etc.), etc. Processor 310 may be a dedicated component or a non-dedicated component (e.g., a shared resource).

Processor 310 may control the overall operation or a portion of operation(s) performed by device 300. Processor 310 may perform one or multiple operations based on an operating system and/or various applications or computer programs (e.g., software 320). Processor 310 may access instructions from memory/storage 315, from other components of device 300, and/or from a source external to device 300 (e.g., a network, another device, etc.). Processor 310 may perform an operation and/or a process based on various techniques including, for example, multithreading, parallel processing, pipelining, interleaving, etc.

Memory/storage 315 includes one or multiple memories and/or one or multiple other types of storage mediums. For example, memory/storage 315 may include one or multiple types of memories, such as, random access memory (RAM), dynamic random access memory (DRAM), cache, read only memory (ROM), a programmable read only memory (PROM), a static random access memory (SRAM), a single in-line memory module (SIMM), a dual in-line memory module (DIMM), a flash memory (e.g., a NAND flash, a NOR flash, etc.), and/or some other type of memory. Memory/storage 315 may include a hard disk (e.g., a magnetic disk, an optical disk, a magneto-optic disk, a solid state disk, etc.), a Micro-Electromechanical System (MEMS)-based storage medium, and/or a nanotechnology-based storage medium. Memory/storage 315 may include a drive for reading from and writing to the storage medium.

Memory/storage 315 may be external to and/or removable from device 300, such as, for example, a Universal Serial Bus (USB) memory stick, a dongle, a hard disk, mass storage, off-line storage, network attached storage (NAS), or some other type of storing medium (e.g., a compact disk (CD), a digital versatile disk (DVD), a Blu-Ray disk (BD), etc.). Memory/storage 315 may store data, software, and/or instructions related to the operation of device 300.

Software 320 includes an application or a program that provides a function and/or a process. Software 320 may include an operating system. Software 320 is also intended to include firmware, middleware, microcode, hardware description language (HDL), and/or other forms of instruction. Additionally, for example, user device 205 may include logic to perform tasks, as described herein, based on software 320.

Communication interface 325 permits device 300 to communicate with other devices, networks, systems, devices, and/or the like. Communication interface 325 includes one or multiple wireless interfaces and/or wired interfaces. For example, communication interface 325 may include one or multiple transmitters and receivers, or transceivers. Communication interface 325 may include one or more antennas. For example, communication interface 325 may include an array of antennas. Communication interface 325 may operate according to a protocol stack and a communication standard. Communication interface 325 may include various processing logic or circuitry (e.g., multiplexing/de-multiplexing, filtering, amplifying, converting, error correction, etc.).

Input 330 permits an input into device 300. For example, input 330 may include a keyboard, a mouse, a display, a button, a switch, an input port, speech recognition logic, a biometric mechanism, a microphone, a visual and/or audio capturing device (e.g., a camera, etc.), and/or some other type of visual, auditory, tactile, etc., input component. Output 335 permits an output from device 300. For example, output 335 may include a speaker, a display, a light, an output port, and/or some other type of visual, auditory, tactile, etc., output component. According to some embodiments, input 330 and/or output 335 may be a device that is attachable to and removable from device 300.

Device 300 may perform a process and/or a function, as described herein, in response to processor 310 executing software 320 stored by memory/storage 315. By way of example, instructions may be read into memory/storage 315 from another memory/storage 315 (not shown) or read from another device (not shown) via communication interface 325. The instructions stored by memory/storage 315 cause processor 310 to perform a process described herein. Alternatively, for example, according to other implementations, device 300 performs a process described herein based on the execution of hardware (processor 310, etc.).

Figure 4:
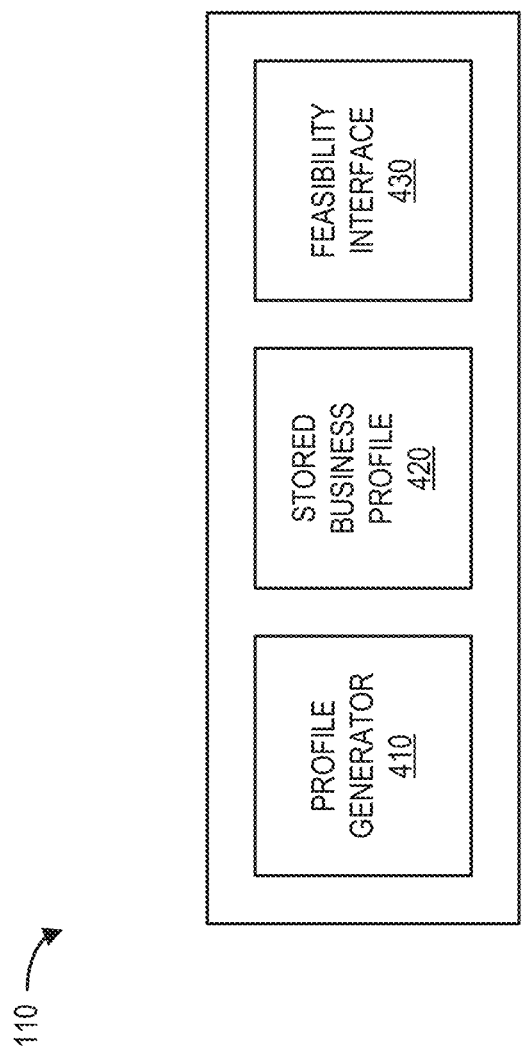
FIG. 4 illustrates exemplary logical components of the of the business profiles engine of FIG. 2.

FIG. 4 depicts exemplary logical components of business profiles engine 110. As shown in FIG. 4, business profiles engine 110 may include a profile generator 410, stored business profiles 420, and a feasibility interface 430. Generally, business profiles in business profiles engine 110 may identify technology, actual workspace utilization, and behaviors based on, for example, past projects and business relationship manager input. Business profiles may relate to a department, a work group, an entity, etc.

Profile generator 410 may include a user interface to obtain, solicit, receive, and present business profile data. Profile generator 410 may accept input files and/or provide input fields to receive input from a user. Input files may include data from sensors and/or use-related records. For example, workspace access records (e.g., from employee access badges, entry logs, onsite observations, etc.), technology use records (e.g., computers, phones, collaborative tools, etc.), utility records, etc., may be provided to profile generator 410. Input fields may include, for example, structured input fields for a web-based interface, such as radio buttons, check boxes, dropdown menus, and/or sliders. Typical information collected by profile generator 410 may include headcounts, a leverage ratio, a collaboration-focus ratio, specialty space parameters, etc.

Headcount may include an expected headcount a workspace will serve. In one implementation, headcount may be specified manually (e.g., all people in marketing). In another implementation, profile generator 410 may identify headcount through sensor detections. For example, the access records for a workgroup for which a space is to be designed can be reviewed over a historic timeframe to predict actual space usage.

A leverage ratio may include, for example, the portion of headcount expected to use space at a given time. A leverage ratio may vary for different departments (e.g., finance groups may need to be in an office more than lawyers). The leverage ratio can be manually specified, or profile generator 410 may identify a leverage ratio from sensor data.

A collaboration-focus ratio may include a division of a workspace space that should be devoted to collaboration activities versus a portion of the space that should be devoted to "focus" rooms (e.g., quiet work space). A collaboration-focus ratio may vary for different departments. In other implementations, ratios for different types of uses may be applied. Specialty space parameters may include an amount of space (e.g., square footage) needed for department-specific requirements, such as specialized equipment (e.g., plotters, lab space, library, etc.) or certain amounts of office equipment (e.g., printers, workstations). Collaboration-focus ratio and specialty space parameters may be manually entered into the user interface of profile generator 410.

According to one implementation, profile generator 410 may translate behaviors into requirements for space use and features. For example, profile generator 410 may use historical occupancy patterns, noise level data, phone/technology use patterns, etc., of a workgroup or department to determine workspace use ratios.

Stored business profiles 420 may include profiles for different departments and/or organizations. In one implementation, stored business profiles 420 may include collected data from past workspace projects used to develop/train profile generator 410 or other logical components of the CPDS 100. In another implementation, stored business profiles 420 may be retrieved and/or edited using, for example, a user interface of profile generator 410.

Feasibility interface 430 may include a logical interface for exchanging data with feasibility engine 120. For example, feasibility interface 340 may include a suite of application programming interfaces (APIs) to provide business profile data in a consistent format that can be applied by feasibility engine 120. Data from business profile engine 110 may be used to provide improved conceptual design which may help to streamline the design phase.

Figure 5:
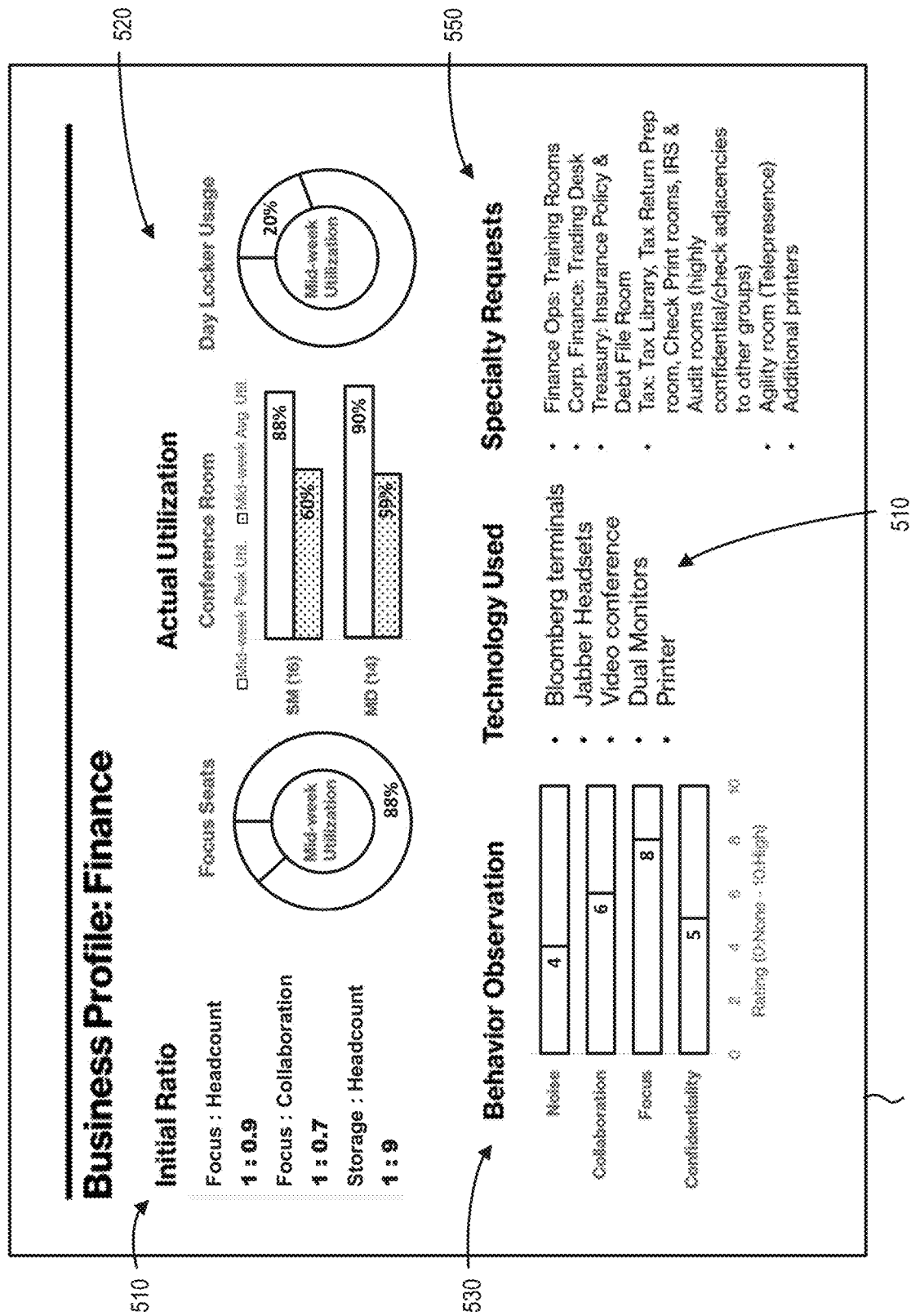
FIG. 5 shows an exemplary user interface that may be generated by the business profiles engine of FIG. 2.

FIG. 5 is an exemplary screen shot of a profile interface 500 that may be generated by business profile engine 110. Profile interface 500 may be presented on, for example, user device 205. Profile interface 500 may present sections of a business profile based on inputs to and information derived by profile generator 410. As shown in FIG. 5, profile interface 500 may include initial ratios section 510, an actual utilization section 520, a behavior section 530, a technology section 540, and a specialty section 550.

Initial ratios section 510 may include initial ratios for focus space to headcount, focus space to collaboration space, and storage space to headcount space. Ratios may be based on manual input, derivations from one or more other parameters, or historical data. Actual utilization section 520 may include workspace statistics for average and peak uses during typical work days (e.g. mid-week). For example, actual utilization section 520 may show graphical representations of different use scenarios, such as focus seating, conference room seating (e.g., for small (sm), medium (md), and/or large sizes), and storage/locker use.

Behavior section 530 may include ratings of different occupant behaviors that can affect workspace requirements, such as noise levels, collaboration activities, focus activities, and confidentiality. Ratings for behavior section 530 may be provided, for example, based on historical statistics, projected needs, etc. Technology section 540 may include technology types associated with use by occupants of the profiled group (e.g., that would impact a workspace design). Data (e.g., types of technology) for technology section 540 may be populated based on user input, previous purchase orders, or other records.

Specialty section 550 may include features or needs that may impact a workspace design. For example, a training room, a file room, a library, a printing room, or additional equipment may be included in specialty section 550. In one implementation, each item listed in specialty section 550 may include a hyperlink to present additional details of the corresponding item. For example, selection of a file room in specialty section 550 may cause profile interface 500 to present a popup window with space requirements, equipment, and/or a point of contact (e.g., a person's name or title) associated with the file room.

Figure 6:
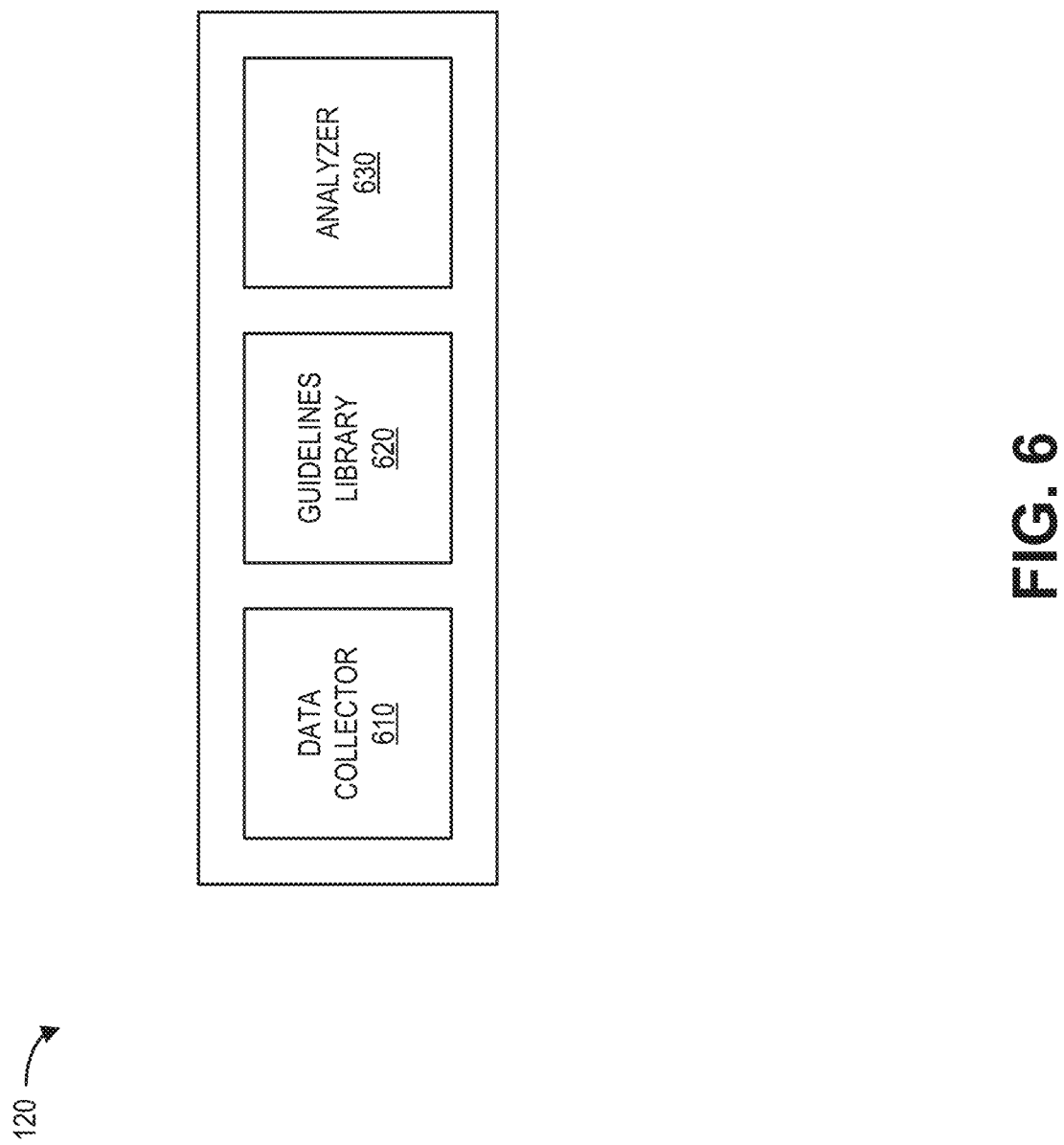
FIG. 6 is a block diagram of exemplary logical components of the of the feasibility engine of FIG. 2.

FIG. 6 illustrates logical components of feasibility engine 120. As shown, feasibility engine 120 may include a data collector 610, a guidelines library 620, and an analyzer 630. Feasibility engine 120 may be used to anticipate space requirements and establish workspace design strategies. For example, feasibility engine 120 may provide specifications for potential workspace layouts based on a variety of inputs, such as cost, timing, business profiles, and layout.

Data collector 610 may include a user interface and/or APIs to solicit spend thresholds, costs, completion deadlines, order and work times, business profile information, layout information, and the like. For example, data collector 610 may solicit spend thresholds and completion deadlines from user input based on a budget or specification. Data collector 610 may obtain cost information from cost profiles for labor, equipment, etc. Data collector 610 may obtain order and work times from product catalogs, automated requests, or user input. Data collector 610 may obtain headcounts, space requirements, and technology needs from business profiles in business profile engine 110 and obtain layout information from design component engine 130 and/or modularity planner 140.

Guidelines library 620 may include a library (e.g., a data structure) of workplace standards (e.g., industry guidelines, corporate standards, etc.) for spacing, storage, etc., relative to workgroup sizes. For example, guidelines library 620 may include a target square feet per person and typical dimensions for focus and collaborative spaces.

Analyzer 630 may use information from data collector 610 to generate metrics for a workspace design. The metrics may be based on, for example, a set of stored workplace guidelines in guidelines library 620. For example, analyzer 630 may apply the proposed headcount, business profile leverage ratio, specialty space requirements, and focus-to-collaboration ratios to determine a necessary workspace size. Additionally, analyzer 630 may identify a number of rooms, room sizes, and support space (e.g., closets, lockers, pantry, mail room, entryway, etc.) to accommodate the business profile at a given headcount. According to an implementation, analyzer 630 may provide an interactive tool that a user/planner may use to adjust and evaluate workspace design metrics for a particular business profile.

According to another implementation, analyzer 630 may dynamically verify workspace requirements, budget, and time constraints against proposed spaces to identify conflicts/feasibility. For example, analyzer 630 may determine if workspace for a given business profile is feasible in a space with a given net usable square feet (NUSF). According to another implementation, as described further below, analyzer 630 may interface with modularity planner 140 to receive design updates and determine the business profile impact and/or feasibility of design changes as they occur. For example, analyzer 630 may provide an alert (e.g., when a user saves a project layout) if the design fails to meet space requirements based on the combination of the workspace metrics.

Figure 7:
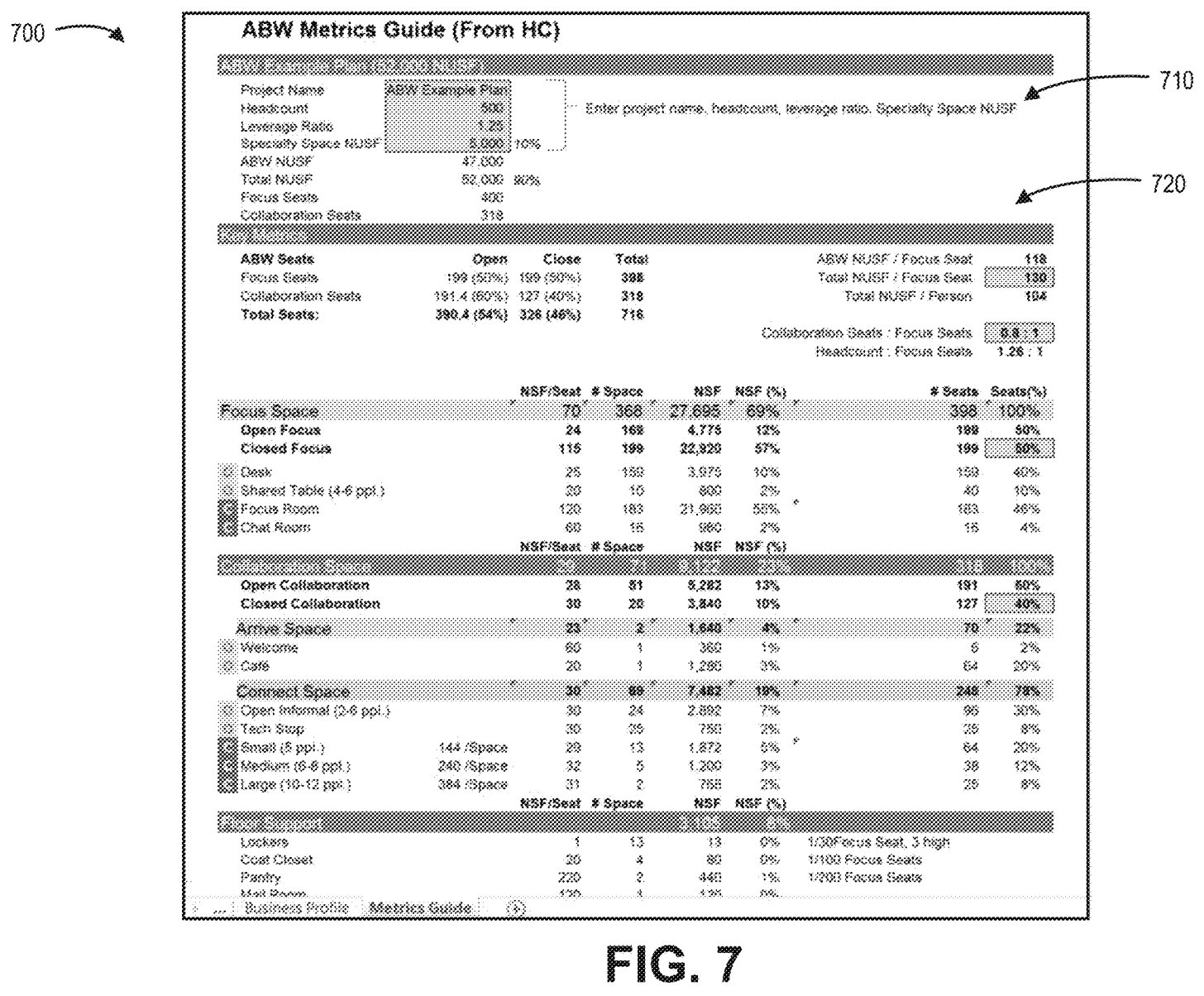

FIG. 7 shows an exemplary screen shot of an interactive metrics tool 700 that may be generated by the feasibility engine 120. Interactive metrics tool 700 may be presented, for example, on user device 205. Interactive metrics tool 700 may present design metrics for a given headcount and leverage ratio corresponding to a particular business profile. As shown in the example of FIG. 7, interactive metrics tool 700 may include a user input area 710 where a user/planner may enter a project name, headcount, and leverage ratio, and specialty space value. Based on the input in user input area 710 and the selected business profile (e.g., from business profile engine 110), feasibility engine 120 may generate a results section 720 that may be presented in interactive metrics tool 700, such as an interactive spreadsheet. Results in results section 720 may include, for example, numbers of seats and square footage required for the total space and for the different types of spaces (e.g., focus space, collaboration space, support space, etc.) within the overall space. While feasibility engine 120 may automatically generate results, the ratios may be adjusted by users, with the changes being populated through the remaining project functions.

Figure 8:
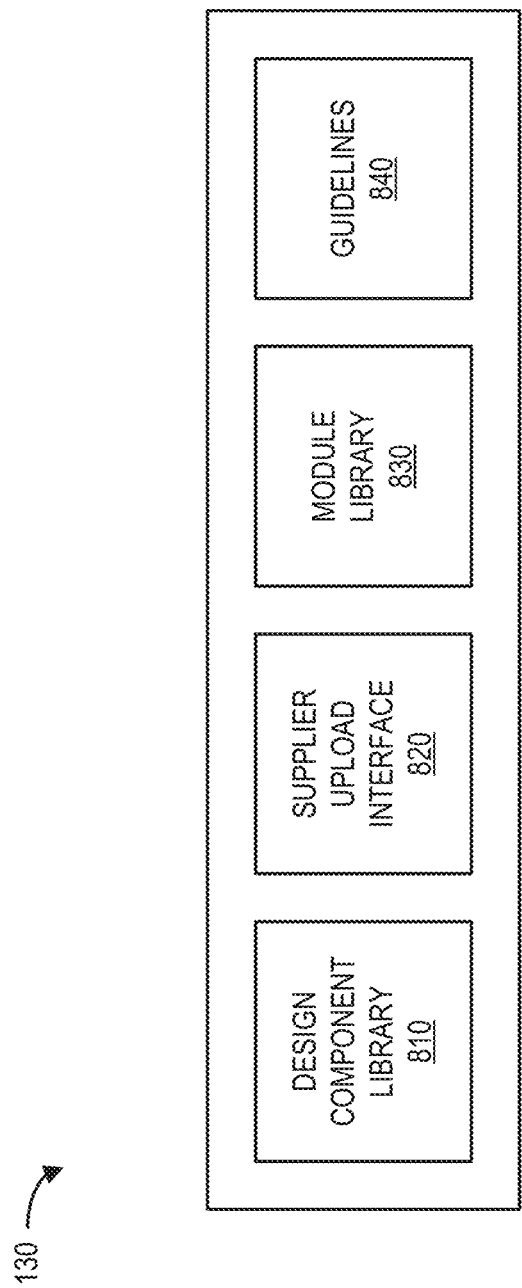
FIG. 8 depicts exemplary logical components of the of the design component engine of FIG. 2.

FIG. 8 illustrates exemplary logical components of design component engine 130. As shown in FIG. 8, design component engine 130 may include a design component library 810, a supplier upload interface 820, a module library 830, and guidelines 840. Design component engine 130 may be used to translate business profile behaviors into requirements for space use and features.

Design component library 810 includes a library (e.g., a data structure) of available design elements that can potentially be deployed to a workspace. The design components may include furniture, partitions (clear or opaque), office equipment, specialized equipment (e.g., lab equipment, printing equipment, etc.) and permanent construction. Design component library 810 stores data (or component parameters) that are descriptive of each component. The data for each component may include dimensioning information (e.g., length, width, height), appearance information (e.g., color, material), cost information, manufacturer information (e.g., stock-keeping units (SKUs), country of origin, etc.), availability information (e.g., time to delivery, shipping location, shipping type, etc.), performance information (e.g., warranty, depreciation life, mean-time-to-failure (MTTF)), utility requirements information (e.g., network connectivity, power requirements, temp requirements, airflow requirements, etc.), efficiency information (e.g., green building certifications, etc.), installation information (e.g., typical install time, specialties involved, dependencies, etc.). According to another implementation, component data can also include 3D visualization information to allow a visualization tool (e.g., modularity planner 140) to depict designs using the component.

Supplier upload interface 820 may provide an interface to accept design component data for design component library 810. Suppliers that wish to have their components available for use in projects with CPDS 100 can provide the component information for storage in design component library 810. According to one implementation, supplier upload interface 820 may include a set of APIs for information uploads. An API may use a collection of functions and procedures, referred to as API calls, that can be executed by other applications. For example, supplier upload interface 820 may receive API calls from a supplier application (e.g., an application residing on user device 205) to initiate uploading of design component data for one or more components. In one implementation, supplier upload interface 820 may include logic that allows for validating an API call from user device 205 before accepting the design component data associated with the API call.

Module library 830 may include three-dimensional models of different modules that may be compiled into all or part of a workspace. In one implementation, modules in module library 830 may include multi-component groupings, such as doorways or ceilings, or enclosed spaces, a conference room, a pantry, a storage space, or other areas with defined boundaries. In another implementation, modules in module library 830 may include, for example, flexible workspace areas for particular square footage and/or headcounts. Modules generally may accelerate design, front end decision making, shop drawings, and project submittals. According to an implementation described herein, modules may be designed for reuse (e.g., minimizing waste), may maximize utilization and recycling of waste; and may allow for selection from an array of environmentally-friendly materials and finishes that meet building certifications and initiatives (e.g., environmental certifications, WELL Building Initiative, etc.).

Guidelines 840 may include a data structure (e.g., a database, table, list, etc.) of information, standards, policies, best practices, and/or assumptions for workspace design. For example, guidelines 840 may include standard measurement techniques for measuring space, assumptions for counting seats, and criteria for defining work zones, etc. Guidelines 840 may include workgroup specific information, company-specific information, and/or industry-specific information that may impact proposed workspace designs.

Figure 9:
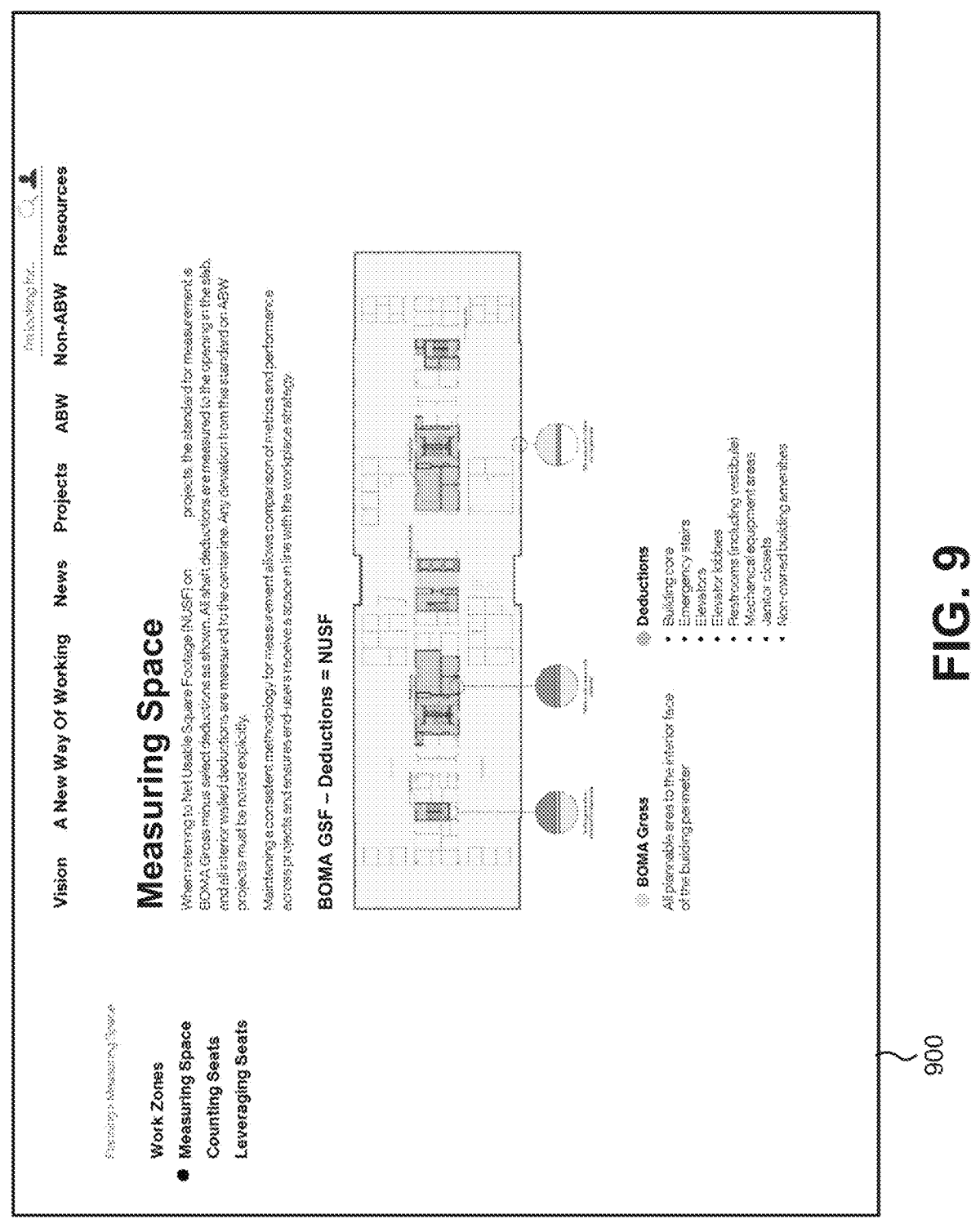

FIG. 9 shows an exemplary screen shot of interactive design guidelines 900 that may be generated by the design component engine 130. Interactive design guidelines 900 may be presented, for example, on user device 205. Interactive design guidelines 900 may present design guidelines and planning instructions for building a workspace. As shown in FIG. 9, interactive design guidelines 900 may include standard information and assumptions for a workspace, such as standard measurement techniques for measuring space, counting seats, leveraging seats, and defining work zones.

Figure 10:
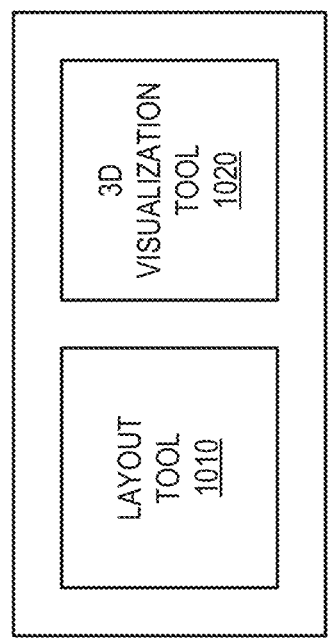
FIG. 10 shows exemplary logical components of the of the modularity planner of FIG. 2.

FIG. 10 illustrates exemplary logical components of modularity planner 140. As shown in FIG. 10, modularity planner 140 may include a layout tool 1010 and a 3D visualization tool 1020. Modularity planner 140 may provide visual renderings that allow for fast and seamless changes to infrastructure (electrical/data, technology, finishes) minimizing disruption and cost. Modularity planner 140 may also allow for early design decision making to help avoid changes and cost and schedule impacts.

Layout tool 1010 may include a user interface to configure a workspace based on previous inputs and guidelines. For example, layout tool 1010 may apply the business profile from business profile engine 110, project data from feasibility engine 120, and design component data from design component library 820 as part of the design layout process. In one implementation, layout tool 1010 may provide a user interface with an initial representation of a space. The initial representation may be a 2D or 3D representation of fixed components of a workspace, such as fixed walls, ceilings, flooring, etc. A floorplan may be created though a manual process of adding design components (e.g., design elements selected from design component library 820) to the representation of the space. As design elements are added, the element information is used to dynamically update the project information. For example, a particular design element (e.g., a workstation) may be placed on the space representation, and the cost of the workstation may be reflected in the project cost, the time required to acquire the workstation may be reflected in a project timeline, the supplier information may be included in the work orders for the project, and the usage information may be calculated to measure against the requirements of the business profile. A designer can select design elements from the design element library.

3D virtualization tool 1020 allows for visual depiction of design components as they would exist in the proposed design. In one implementation, component data from design component library 820 may be used to create a visualization. The visualization allows a "first person" experience, in which viewers to "walk" through the proposed design, seeing the various design components as they would be actually deployed. 3D virtualization tool 1020 allows for real-time modifications to design elements, so that users can make edits as the space is traversed. This capability is particularly beneficial for receiving (and making changes based on) interested party feedback, without the need to prepare further floorplans or iterations of review sessions. In another implementation, modules from module library 830 may be used to create a visualization in conjunction with a customized floorplan.

For example, design components in module library 830 may include a modular unit assembled from multiple design components. Using layout tool 1010, a user may insert a module into a workspace layout. 3D visualization tool 1020 may generate an interactive virtual three-dimensional rendering of the modular unit for presentation to the user and may receive changes to the modular unit (e.g., a modular wall configuration, modular wall components, a type of door, a component location, different finishes, etc.) within the visualization tool. 3D visualization tool 1020 may update the interactive virtual three-dimensional rendering to reflect the changes and provide the change information to other functions of CPDS 100 (e.g., business profiles engine 110, feasibility engine 120, design component engine 130, or concurrent manager 150) to dynamically update the project timeline and cost for the proposed design, based on the change to the modular unit. By adjusting discrete modules (e.g., in contrast with entire workspaces), changes and impacts can be assessed in real-time without delays for confirming interoperability of other design aspects.

Figure 11:
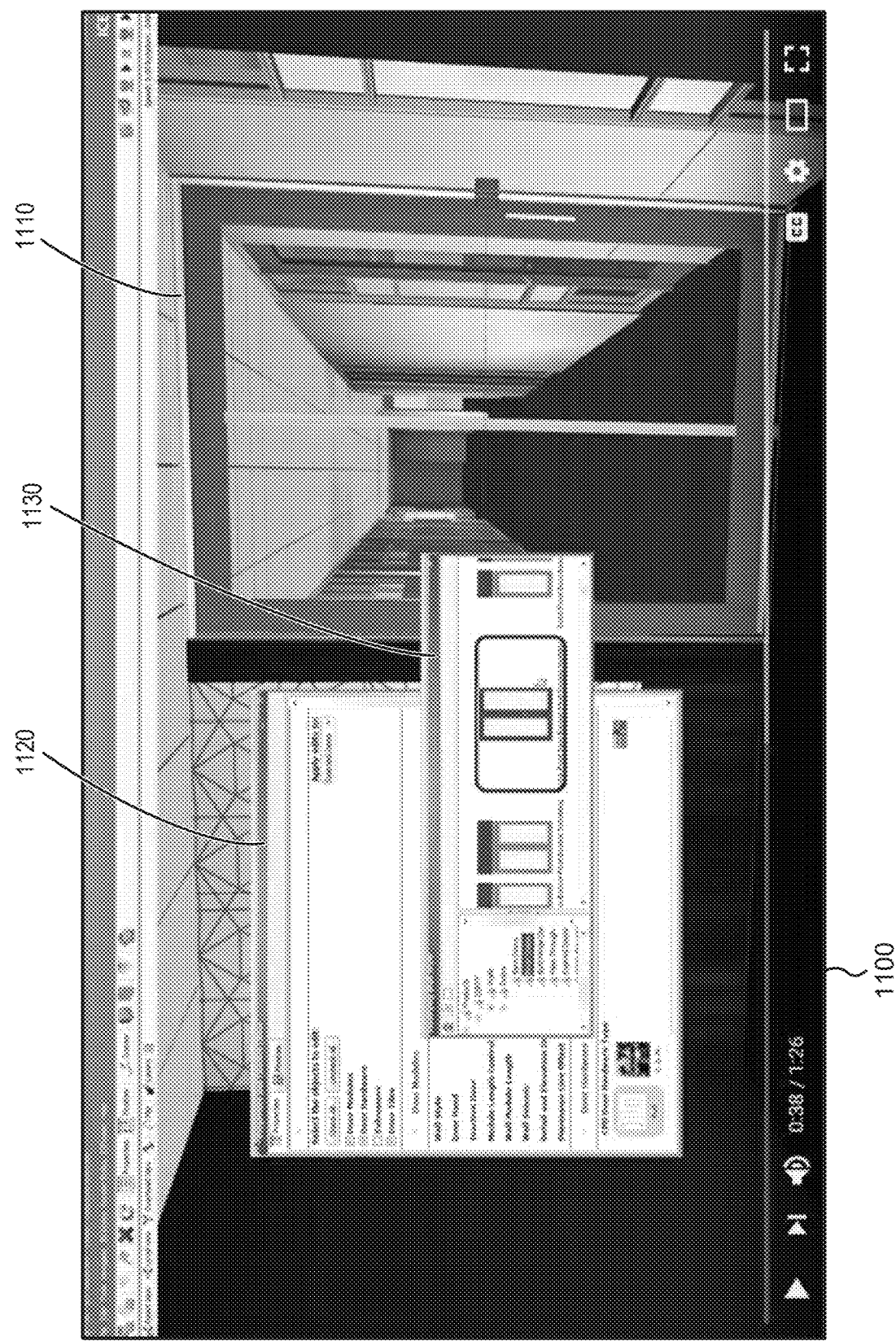
FIG. 11 illustrates an exemplary user interface that may be generated by the modularity planner of FIG. 2.

FIG. 11 shows an exemplary screen shot of an interactive visualization 1100 that may be generated by 3D virtualization tool 1020. Visualization 1100 may be presented on, for example, user device 205. Visualization 1100 may present a visual depiction of design components and/or modules as they would exist in a proposed design. As shown, interactive visualization 1100 may include a 3D rendering 1110, an object selection interface 1120, and an object properties interface 1130.

3D rendering 1110 may include an interactive 3d visual depiction, such as a virtual reality image of a proposed workspace. In another implementation, 3D rendering 1110 may be presented within a virtual reality headset. Object selection interface 1120 may provide a menu of components or modules that may be selected for changes. Object properties interface 1130 may include a menu of options associated with each component or module selected in object selection interface 1120. For example, object properties interface 1130 may include offerings from different vendors, different colors/textures, different hardware, etc. During a virtual walkthrough of 3D rendering 1110, a user/designer may select components and change component properties. The changes may be presented in an updated visualization 1100 with the changes. According to one implementation, changes may be accepted or rejected by the user. Accepted changes may be fed back into one or more of feasibility engine 120, design component engine 130, modularity planner 140, concurrent manager 150, or stored designs 235.

Figure 12:
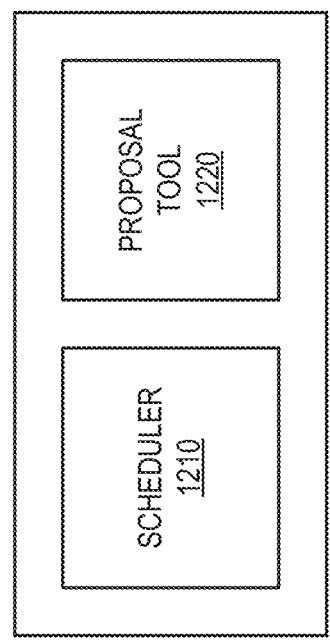
FIG. 12 illustrates exemplary logical components of the of the concurrent manager of FIG. 2.

FIG. 12 illustrates exemplary logical components of concurrent manager 150. As shown in FIG. 12, concurrent manager 150 may include a scheduler 1210 and a proposal tool 1220.

Scheduler 1210 may create of project timelines based on the details of the design. In one implementation, scheduler 1210 may generate a plan for concurrent development. That is, development processes that can be done concurrently are scheduled in overlapping ways, allowing for a quicker completion time. According to an implementation, scheduler 1210 may apply design component data from design component engine 130 to determine when orders need to be placed to acquire design component supplies, how dependencies impact installation, installation time estimates, etc.

Proposal tool 1220 may provide an interface whereby a service provider can make a proposal for providing a service (e.g., electrical installation, drywall, flooring, etc.) associated with an item specified in the project management timeline, knowing the timing, cost parameters and floorplan.

Figure 13:
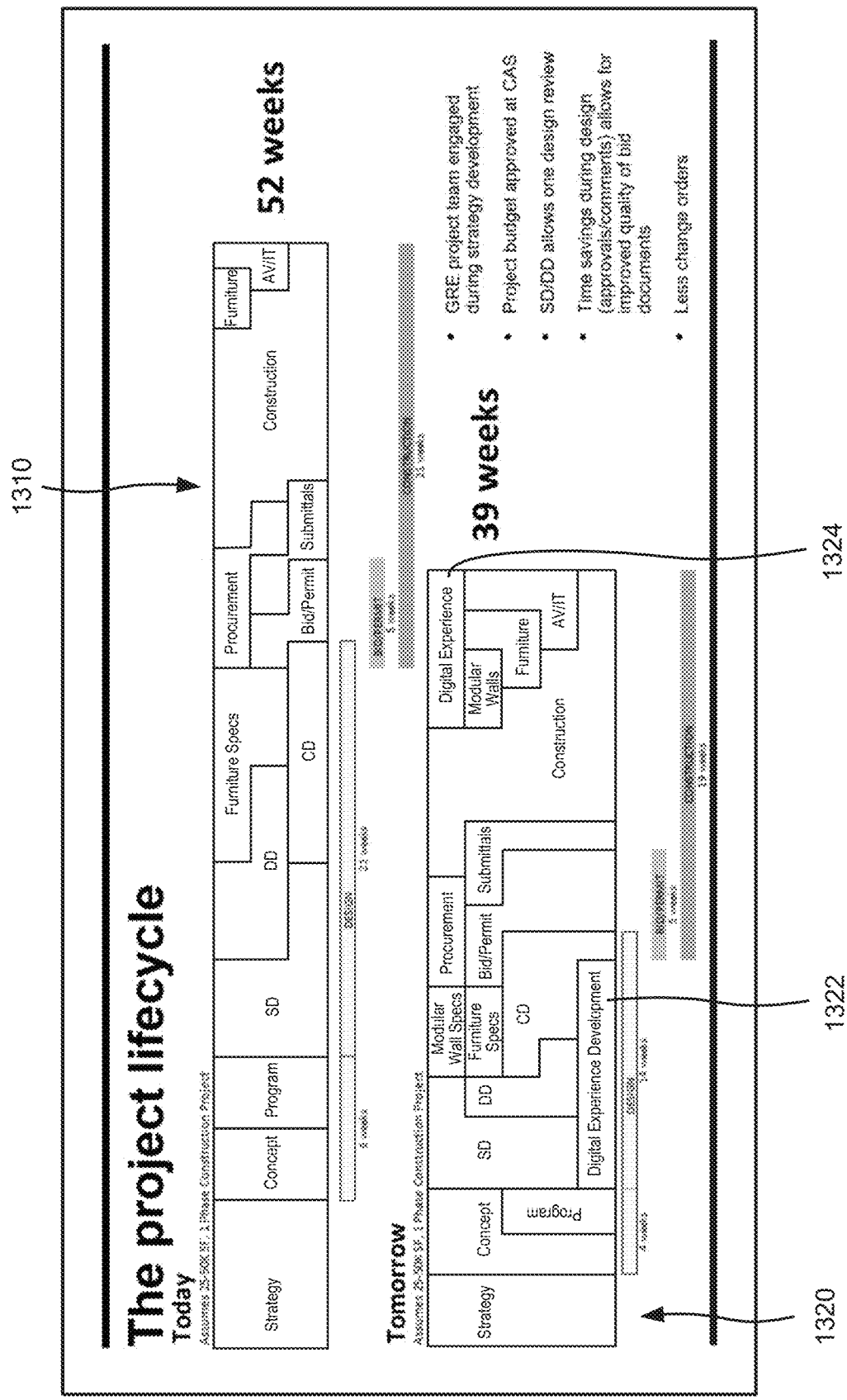
FIG. 13 shows an exemplary user interface that may be generated by the concurrent manager of FIG. 2.

FIG. 13 provides a comparison of construction project lifecycles for the same workspace project. A first project lifecycle 1310 assumes convention project development, while a second project lifecycle 1320 applies concurrent development available with the concurrent project development system described herein. Particularly, project lifecycle 1320, which may be generated by concurrent manager 150, is able to compress design concept, program, schematic design (SD), design development (DD), and construction documents (CD), through the integration of business profiles, feasibility analysis, component data, and modular construction.

Project lifecycle 1320 integrates a digital experience development phase 1322 and a digital experience installation phase 1324. A digital experience uses technology to combine content and data to create an emotional connection between brand and customer by engaging them in the center of the experience. The digital experience may be considered a separate design effort that is coordinated with the infrastructure and design of a workspace. For example, a digital experience may include screens and/or projectors integrated within a wall or entryway to present adaptive content (e.g., images and/or virtual reality). In the digital experience development phase 1322, the digital experience layout may be generated in conjunction with the schematic design phase, design development phase, and construction documents phase of a workspace. Similarly, modular wall specifications and furniture specifications may provide details for modeling space partitions, available cable layouts, seating arrangements, etc., that may impact digital experience development phase 1322. Concurrent with a part of the construction phase, digital experience installation phase 1324 may coordinate the digital experience installation with the rest of the workspace to simplify equipment delivery, installation, and approvals (e.g., through use of modularity planner 140).

Figure 14:
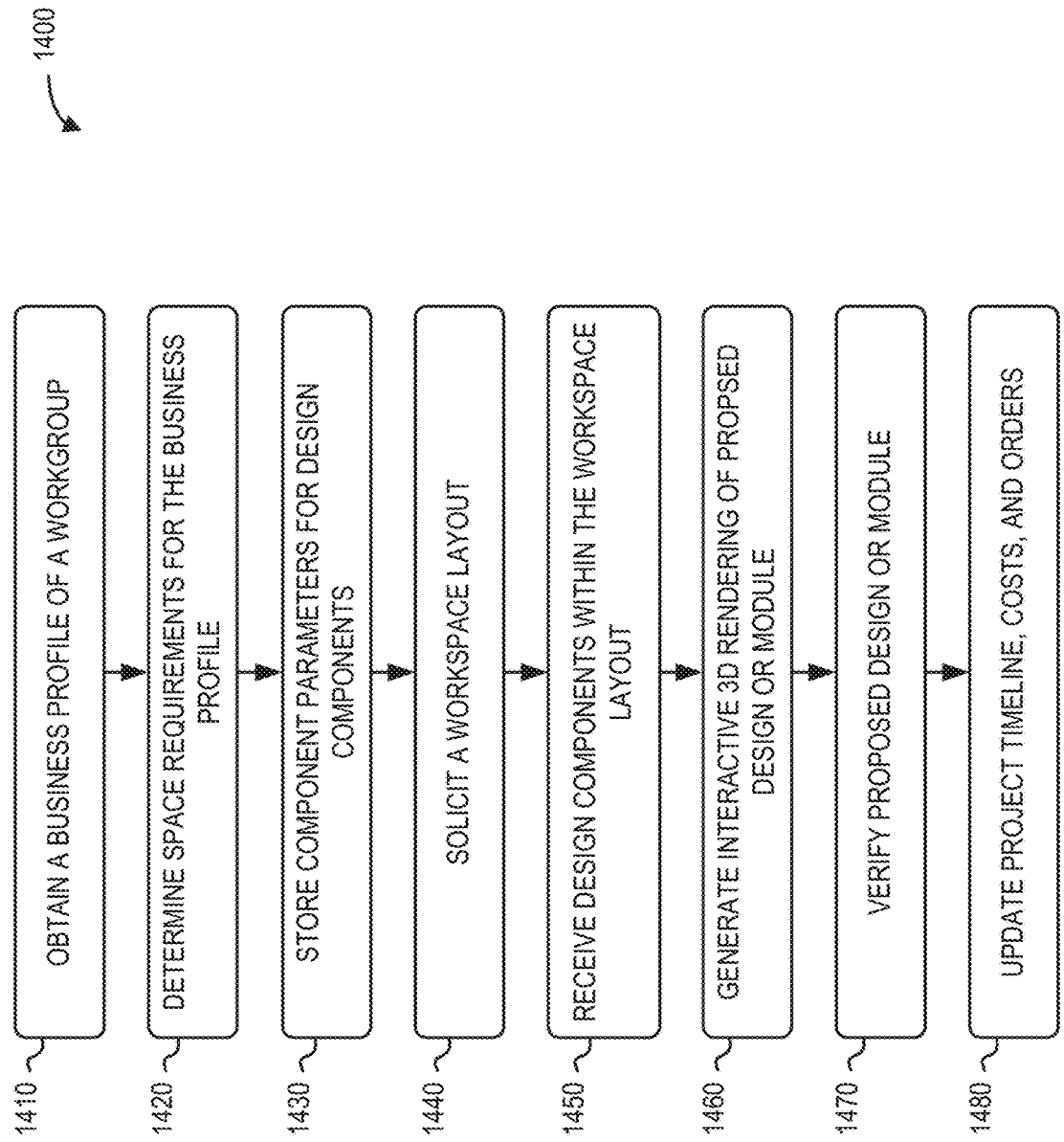
FIG. 14 is a flowchart of an exemplary process for physical space planning, according to an implementation described herein.

FIG. 14 a flowchart of an exemplary process for physical space planning, according to an implementation described herein. In one implementation, process 1400 may be performed by workplace delivery portal 230. In another implementation, process 1400 may be performed by one or more of business profiles engine 110, feasibility engine 120, design component engine 130, modularity planner 140, or concurrent manager 150.

Process 1400 may include obtaining a business profile of a workgroup (block 1410), and determining space requirements for the business profile (block 1420). For example, business profile engine 110 may generate a business profile for a department or workgroup based on user input and/or workgroup data. Feasibility engine 120 may obtain the business profile and apply commercial and/or corporate standards to define a workspace design metrics, which may be output to a user.

Process 1400 may further include storing component parameters for design components (block 1430), and soliciting a workspace layout (block 1440). For example, design component engine 130 may store component parameters for design components that can potentially be deployed to the activity-based workspace. Component parameters may include, for example, dimensioning information, appearance information, utility requirements information, cost information, installation information, and/or availability information. Modularity planner 140 may provide a user interface with a workspace layout, sized according to the business profile, with design components that can be selectively placed within the workspace layout.

Process 1400 may also include receiving design components within the workspace layout (block 1450) and generating an interactive 3D rendering of a proposed design or module (1460). For example, modularity planner 140 may receive design components within the workspace layout, via the graphical user interface, to create a proposed design. Based on the design components, modularity planner 140 may generate an interactive three-dimensional rendering of the proposed design.

Process 1400 may additionally include verifying a proposed design or module (block 1470), and updating a project timeline, cost, and orders (block 1480). For example, feasibility engine 120 may receive the proposed design and dynamically verify workspace requirements, budget, and/or time constraints against proposed spaces to identify conflicts/feasibility. Also, concurrent manager 150 may generate a project timeline that includes project work orders, project costs, design schedules, and construction schedules based on the combination of component parameters used in the proposed design. In another implementation, concurrent manager 150 may assist in timeline creation within a project planning user interface by retrieving timeframes and/or verifying schedules against constraints in design component engine 130. In still another implementation, concurrent manager 150 may validate a project timeline based on data from design component engine 130.

The benefits of the systems and methods described herein are multiple. Design projects can be developed and completed in accelerated timelines compared to typical design projects. Projects can be presented to interested parties in easier-to-visualize formats, to allow these parties to provide their feedback in more concrete ways and obtain higher levels of "buy-in" from impacted parties. Design components can be sourced from multiple sources, and the system allow competitive bidding and easy substitution of components.

The foregoing description of implementations provides illustration and description, but is not intended to be exhaustive or to limit the invention to the precise form disclosed. Modifications and variations are possible in light of the above teachings or may be acquired from practice of the invention. For example, while a series of blocks have been described with regard to FIG. 14, the order of the blocks and message/operation flows may be modified in other embodiments. Further, non-dependent blocks may be performed in parallel.

Certain features described above may be implemented as "logic" or a "unit" that performs one or more functions. This logic or unit may include hardware, such as one or more processors, microprocessors, application specific integrated circuits, or field programmable gate arrays, software, or a combination of hardware and software.

To the extent the aforementioned embodiments collect, store or employ personal information of individuals, it should be understood that such information shall be collected, stored and used in accordance with all applicable laws concerning protection of personal information. Additionally, the collection, storage and use of such information may be subject to consent of the individual to such activity, for example, through well known "opt-in" or "opt-out" processes as may be appropriate for the situation and type of information. Storage and use of personal information may be in an appropriately secure manner reflective of the type of information, for example, through various encryption and anonymization techniques for particularly sensitive information.

Use of ordinal terms such as "first," "second," "third," etc., in the claims to modify a claim element does not by itself connote any priority, precedence, or order of one claim element over another, the temporal order in which acts of a method are performed, the temporal order in which instructions executed by a device are performed, etc., but are used merely as labels to distinguish one claim element having a certain name from another element having a same name (but for use of the ordinal term) to distinguish the claim elements.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

All structural and functional equivalents to the elements of the various aspects set forth in this disclosure that are known or later come to be known to those of ordinary skill in the art are expressly incorporated herein by reference and are intended to be encompassed by the claims. No claim element of a claim is to be interpreted under 35 U.S.C. § 112(f) unless the claim element expressly includes the phrase "means for" or "step for."

What is claimed is:

1. A method, comprising:
    obtaining, by a computing device, a business profile of a workgroup using an activity-based workspace, wherein the business profile includes a total headcount, a department type, and an activity-based space ratio;
    automatically determining, by the computing device, space requirements to accommodate the business profile based on a set of workplace standards;
    receiving, by the computing device via a supplier upload interface, component parameters from different suppliers for design components that can be deployed to the activity-based workspace, wherein the supplier upload interface includes a structured format to accept, for each design component, dimensioning information, manufacturer information, availability timeline information, installation time information, and three-dimensional visualization information;
    storing, in a memory accessible to the computing device, a library of the component parameters;
    soliciting, via a graphical user interface on the computing device, a workspace layout for the activity-based workspace, wherein the soliciting includes:
        providing a virtual rendering of fixed components of the activity-based workspace, and
        providing, based on the business profile, a list of the design components that can be selectively placed within the workspace layout;
    receiving, via the graphical user interface, placements of the design components within the workspace layout to create a proposed design of the activity-based workspace;
    verifying, by the computing device, the proposed design against the space requirements and the set of workplace standards;
    creating, by the computing device, a project timeline for completing the activity-based workspace, based on the proposed design and using the stored component parameters for the design components in the proposed design, wherein the project timeline includes project work orders, design schedules, and construction schedules;
    generating, by the computing device and based on the stored component parameters, an interactive three-dimensional rendering of the proposed design, wherein the interactive three-dimensional rendering provides a virtual walkthrough experience of the proposed design;
    providing, by the computing device and within the interactive three-dimensional rendering:
        an object selection interface with a menu of the design components from the library that are available to be selected for changes during the virtual walkthrough experience, and
        an object properties interface for each of the design components in the menu, the object properties interface including different options associated with each of the design components;
    receiving, by the computing device, user selections from the object selection interface and the object properties interface to change object properties of one or more design components;
    updating, by the computing device, the interactive three-dimensional rendering, based on the user selections and using the stored component parameters, to provide an updated interactive three-dimensional rendering;
    presenting, by the computing device, the updated interactive three-dimensional rendering;
    receiving an approval of the updated interactive three-dimensional rendering; and
    dynamically updating the project timeline, based on the stored component parameters for the design components, upon receiving approval of the updated interactive three-dimensional rendering.

2. The method of claim 1, wherein obtaining the business profile further comprises:
    obtaining an expected utilization rate.

3. The method of claim 2, wherein obtaining the business profile further comprises:
    converting, by the computing device, historical occupancy records from one or more of sensor data and employee badge data into the expected utilization rate.

4. The method of claim 1, wherein obtaining the business profile further comprises:
    providing a user interface to solicit, for a user, specialty requests for the activity-based workspace.

5. The method of claim 1, wherein the space requirements include a net usable square footage requirement and a total number of seats.

6. The method of claim 5, wherein the determining the space requirements further comprises:
    obtaining the set of workplace standards to which the business profile is applied.

7. The method of claim 1, wherein the supplier upload interface further includes a structured format to accept, for each design component:

information, and utility requirements information.

8. The method of claim 1, wherein the supplier upload interface further includes a structured format to accept, for each design component:

component cost information.

9. The method of claim 1, wherein the design components include a modular unit of multiple components.

10. The method of claim 1, further comprising:

storing, in the memory, design guidelines that define planning and measurement assumptions for the activity-based workspace, and presenting, via the graphical user interface, the design guidelines.

11. The method of claim 1, further comprising:

dynamically updating project cost information based on the proposed design and the stored component parameters.

12. The method of claim 1, further comprising:

dynamically adjusting project work orders to reflect supplier information for the design components within the workspace layout.

13. One or more network devices, comprising:

a communications interface to communicate with a user device;

a memory to store a set of processor-executable instructions; and a processor configured to execute the processor-executable instructions, wherein executing the processor-executable instructions causes the processor to:

obtain a business profile of a workgroup using an activity-based workspace, wherein the business profile includes a total headcount, a department type, and an activity-based space ratio;

automatically determine space requirements to accommodate the business profile based on a set of workplace standards;

receive, via a supplier upload interface, component parameters from different suppliers for design components that can be deployed to the activity-based workspace, wherein the supplier upload interface includes a structured format to accept, for each design component, dimensioning information, manufacturer information, availability timeline information, installation time information, and three-dimensional visualization information;

store a library of the component parameters;

solicit, via a graphical user interface, a workspace layout for the activity-based workspace, wherein the soliciting includes:

providing a virtual rendering of fixed components of the activity-based workspace, and providing, based on the business profile, a list of the design components that can be selectively placed within the workspace layout;

receive, via the graphical user interface, placements of design components within the workspace layout to create a proposed design for the activity-based workspace;

verify the proposed design against the space requirements and the set of workplace standards;

create a project timeline for completing the activity-based workspace, based on the proposed design and using the stored component parameters for the design components in the proposed design, wherein the project timeline includes project work orders, design schedules, and construction schedules;

generate, based on the stored component parameters, an interactive three-dimensional rendering of the proposed design, wherein the interactive three-dimensional rendering provides a virtual walkthrough experience of the proposed design;

provide, within the interactive three-dimensional rendering:

an object selection interface with a menu of the design components from the library that are available to be selected for changes during the virtual walkthrough experience, and an object properties interface for each of the design components in the menu, the object properties interface including different options associated with each of the design components;

receive user selections from the object selection interface and the object properties interface to change object properties of one or more design components;

update the interactive three-dimensional rendering, based on the user selections and using the stored component parameters, to provide an updated interactive three-dimensional rendering;

present the updated interactive three-dimensional rendering;

receive an approval of the updated interactive three-dimensional rendering; and dynamically update the project timeline, based on the stored component parameters for the design components, upon receiving approval of the updated interactive three-dimensional rendering.

14. The one or more network devices of claim 13, wherein the business profile further comprises:

an expected utilization rate.

15. The one or more network devices of claim 13, wherein, when determining the space requirements, the processor is further configured to execute the processor-executable instructions to:

obtaining the set of standards to which the business profile is applied, and calculate a net usable square footage requirement and a total number of seats for the business profile.

16. The one or more network devices of claim 13, wherein, when receiving the component parameters, the processor is further configured to execute the processor-executable instructions to:

receive, via the supplier upload interface, network connectivity requirements, power requirements, and airflow requirements.

17. The one or more network devices of claim 13, wherein the design components include a modular unit of multiple components, and wherein, when generating the interactive three-dimensional rendering, the processor is further configured to execute the processor-executable instructions to:

receive, via the graphical user interface, the modular unit within the workspace layout; and generate an interactive virtual three-dimensional rendering of the modular unit within a visualization tool.

18. A non-transitory computer-readable medium containing instructions executable by at least one processor, the computer-readable medium comprising one or more instructions to cause the at least one processor to:

obtain a business profile of a workgroup using an activity-based workspace, wherein the business profile includes a total headcount, a department type, and an activity-based space ratio;

automatically determine space requirements to accommodate the business profile based on a set of workplace standards;

receive, via a supplier upload interface, component parameters from different suppliers for design components that can be deployed to the activity-based workspace, wherein the supplier upload interface includes a structured format to accept, for each design component, dimensioning information, manufacturer information, availability timeline information, installation time information, and three-dimensional visualization information;

store a library of the component parameters;

solicit, via a graphical user interface, a workspace layout for the activity-based workspace, wherein the soliciting includes:
  providing a virtual rendering of fixed components of the activity-based workspace, and
  providing, based on the business profile, a list of the design components that can be selectively placed within the workspace layout;

receive, via the graphical user interface, placements of design components within the workspace layout to create a proposed design for the activity-based workspace;

verify the proposed design against the space requirements and the set of workplace standards;

create a project timeline for completing the activity-based workspace, based on the proposed design and using the stored component parameters for the design components in the proposed design, wherein the project timeline includes project work orders, design schedules, and construction schedules;

generate, based on the stored component parameters, an interactive three-dimensional rendering of the proposed design, wherein the interactive three-dimensional rendering provides a virtual walkthrough experience of the proposed design;

provide, within the interactive three-dimensional rendering:
  an object selection interface with a menu of the design components from the library that are available to be selected for changes during the virtual walkthrough experience, and
  an object properties interface for each of the design components in the menu, the object properties interface including different options associated with each of the design components;

receive user selections from the object selection interface and the object properties interface to change object properties of one or more design components;

update the interactive three-dimensional rendering, based on the user selections and using the stored component parameters, to provide an updated interactive three-dimensional rendering;

present the updated interactive three-dimensional rendering;

receive an approval of the updated interactive three-dimensional rendering; and dynamically update the project timeline, based on the stored component parameters for the design components, upon receiving approval of the updated interactive three-dimensional rendering.

19. The non-transitory computer-readable medium of claim 18, wherein the business profile further comprises:
  an expected utilization rate, and
  a percentage of at least two types of different activity-based spaces.

20. The non-transitory computer-readable medium of claim 18, wherein the instruction for generating the interactive three-dimensional rendering further comprises instructions to cause the at least one processor to:
  receive, via the graphical user interface, a modular unit within the workspace layout, wherein a modular unit includes multiple components; and
  generate an interactive virtual three-dimensional rendering of the modular unit within a visualization tool.

* * * * *